(12) United States Patent
Sakurai et al.

(10) Patent No.: US 8,912,802 B2
(45) Date of Patent: Dec. 16, 2014

(54) COMPONENT-EMBEDDED CIRCUIT SUBSTRATE AND METHOD OF INSPECTING THE SAME

(71) Applicant: Taiyo Yuden Co., Ltd., Tokyo (JP)

(72) Inventors: Shigeo Sakurai, Tokyo (JP); Tetsuo Saji, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/217,002

(22) Filed: Mar. 17, 2014

(65) Prior Publication Data

US 2014/0285213 A1    Sep. 25, 2014

(30) Foreign Application Priority Data

Mar. 22, 2013    (JP) .................................. 2013-060039

(51) Int. Cl.
| | | |
|---|---|---|
| *G01R 31/02* | (2006.01) | |
| *G01R 27/26* | (2006.01) | |
| *G01R 31/04* | (2006.01) | |
| *H05K 1/18* | (2006.01) | |
| *H05K 1/02* | (2006.01) | |

(52) U.S. Cl.
CPC ............ *G01R 31/048* (2013.01); *G01R 31/028* (2013.01); *H05K 1/185* (2013.01); *H05K 1/0268* (2013.01); *G01R 27/26* (2013.01)
USPC ........... 324/538; 324/519; 324/527; 324/528; 324/537; 324/548; 324/555

(58) Field of Classification Search
CPC .. G01R 27/26; G01R 27/2605; G01R 31/013; G01R 31/016; G01R 31/02; G01R 31/028

USPC .......... 324/538, 519, 527, 528, 537, 548, 555
See application file for complete search history.

(56) References Cited

U.S. PATENT DOCUMENTS

| | | | |
|---|---|---|---|
| 2005/0035754 A1* | 2/2005 | Ho et al. .................... | 324/158.1 |
| 2007/0168148 A1* | 7/2007 | Jow et al. ...................... | 702/117 |
| 2008/0145995 A1* | 6/2008 | Borland et al. ................ | 438/381 |
| 2008/0169825 A1* | 7/2008 | Kurita et al. .................. | 324/606 |
| 2012/0098557 A1* | 4/2012 | Krauss et al. ............... | 324/750.3 |

FOREIGN PATENT DOCUMENTS

| | | |
|---|---|---|
| JP | H7-244098 A | 9/1995 |
| JP | H10-145015 A | 5/1998 |
| JP | 2004-221574 A | 8/2004 |
| JP | 2008-292399 A | 12/2008 |
| JP | 2011-142202 A | 7/2011 |

OTHER PUBLICATIONS

Japanese Office Action dated Oct. 2, 2013, in a counterpart Japanese patent application No. 2013-060039.
Japanese Office Action dated Jan. 8, 2014, in a counterpart Japanese patent application No. 2013-060039. (PPH supporting document).

* cited by examiner

*Primary Examiner* — Huy Q Phan
*Assistant Examiner* — David Frederiksen
(74) *Attorney, Agent, or Firm* — Chen Yoshimura LLP

(57) ABSTRACT

In a component-embedded circuit substrate having a plurality of capacitors embedded therein, the capacitors are connected in parallel, inspection electrodes are formed, and the inspection electrodes connect to respective terminal electrodes of the capacitor through via conductors. At the terminal electrodes of the capacitor, the connection position of the via conductors for connecting the inspection electrodes differs from the connection position of via conductors for connecting respective terminal electrodes of the capacitor.

20 Claims, 2 Drawing Sheets

COMPONENT-EMBEDDED CIRCUIT SUBSTRATE AND METHOD OF INSPECTING THE SAME

This application claims the benefit of Japanese Application No. 2013-060039, filed in Japan on Mar. 22, 2013, which is hereby incorporated by reference in its entirety.

BACKGROUND OF THE INVENTION

1. Field of the Invention

The present invention relates to a component-embedded circuit substrate with capacitors embedded therein.

2. Description of Related Art

Capacitors, which are single electronic components, have differing frequency characteristics due to a variety of factors such as the dielectric type, capacitance, and size of each capacitor. Therefore, when using a capacitor in an electronic device, it is difficult to achieve desired characteristics with only a single capacitor. As a countermeasure, it is common to mount a plurality of capacitors in parallel, with each having a different frequency. A typical mounting example of this includes the so-called bypass capacitor (or decoupling capacitor). The bypass capacitor is arranged between the power line and ground in order to stabilize the operation of the electronic circuits. The bypass capacitor lowers the alternating current impedance of the power line with respect to ground and also functions as a filter to eliminate noise. In practice, a capacitor that has a large capacitance but poor high frequency band characteristics is connected in parallel with a capacitor that has a significantly smaller capacitance but good high frequency band characteristics and these are used as the bypass capacitor.

In the manufacturing process of the electronic device, an inspection is performed after the electronic components are mounted on the circuit substrate in order to find mounting defects such as soldering defects or wiring disconnection. However, with parallel capacitor circuits such as bypass capacitors, there are instances when a proper inspection is not possible by merely measuring the composite capacitance. In other words, when the capacitance of one capacitor is less than or equal to the capacitance tolerance range of another capacitor, the value of the measured composite capacitance is in the tolerance range of the capacitor with the larger capacitance even if there is a mounting defect with the capacitor having the smaller capacitance. Thus, the connection defect cannot be detected.

Known methods of inspection to solve this type of problem are respectively disclosed in Patent Documents 1 and 2. In the method disclosed in Patent Document 1, spike voltage waveforms set to the respective frequency bands of the large capacitance capacitor C1 and small capacitance capacitor C2 are used to inspect these capacitors. In the method disclosed in Patent Document 2, a signal generating source is used to generate a prescribed voltage, which is inputted to the output terminal of the capacitor by a probe 1, and measurement is performed by probes P2 and P3 (link guard) connected to the input terminal side of the capacitor.

RELATED ART DOCUMENTS

Patent Documents

Patent Document 1: Japanese Patent Application Laid-Open Publication No. 2008-292399
Patent Document 2: Japanese Patent Application Laid-Open Publication No. 2004-221574

SUMMARY OF THE INVENTION

However, in the method disclosed in Patent Document 1, a special measuring device for outputting the spike voltage waveform is necessary, and additionally, there is a possible issue of variation in the devices causing a drop in accuracy. In the method disclosed in Patent Document 2, measuring is required for each individual capacitor, and thus, the number of inspection steps is increased. A method to reliably detect a mounting defect of a capacitor with few inspection steps and with ordinary inspection equipment is being sought.

Meanwhile, following recent demand for smaller and more functional electronic devices, component-embedded circuit substrates are emerging in which various types of electronic components such as capacitors are embedded in the circuit substrate. In component-embedded circuit substrates, it is not possible to test for mounting defects by the external appearance thereof; thus, inspecting capacitors for mounting defects as described above becomes even more important.

The size of electronic components to be embedded in the component-embedded circuit substrate is also limited. Therefore, it is not possible to use a large-sized large-capacitance capacitor in order to achieve a large amount of capacitance, and it is assumed that a plurality of small capacitors will be connected in parallel instead. Connecting capacitors in parallel in this manner presents inspection difficulties similar to the above-mentioned bypass capacitor. In other words, the largest value of the tolerance range of composite capacitance achieved by connecting all of the capacitors in parallel is the combined tolerance of the respective capacitances of the capacitors. Accordingly, if the value of the respective capacitances of the capacitors is less than or equal to the largest value of the tolerance range of the composite capacitance, then connection defects cannot be detected in the capacitors.

The present invention was made in view of the above situation, and aims at providing a method of reliably detecting a mounting defect of a capacitor, with few inspection steps and with ordinary inspection equipment, in a component-embedded circuit substrate having parallel capacitor circuits embedded therein, and, providing a component-embedded circuit substrate that makes such a method of inspection possible.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a component-embedded circuit substrate includes: a circuit substrate; and a first capacitor and a second capacitor embedded in the circuit substrate, the first capacitor and the second capacitor being connected in parallel by first wiring lines, wherein a capacitance of the second capacitor is greater than a capacitance of the first capacitor, wherein a pair of inspection electrodes are formed on a first main surface of the circuit substrate, wherein the inspection electrodes are respectively connected to terminal electrodes of the first capacitor through second wiring lines, and wherein the respective first and second wiring lines are connected to different areas at the respective terminal electrodes of the first capacitor.

In such a component-embedded circuit substrate, if the first capacitor has a mounting defect such as a wiring disconnection, the connection from the inspection electrodes to the second capacitor is severed. Meanwhile, if the second capacitor has a mounting defect such as a wiring disconnection, only the capacitance of the first capacitor is measured at the inspection electrodes. Accordingly, a mounting defect of the first capacitor can be detected even if the capacitance of the first capacitor is less than or equal to the capacitance tolerance of the second capacitor. Thus, in the inspection of the component-embedded circuit substrate according to the present invention, the component-embedded circuit substrate may be judged to be non-defective when the capacitance between the pair of inspection electrodes is measured and is in the tolerance range of the capacitance of the first capacitor.

Another component-embedded circuit substrate according to the present invention includes: a circuit substrate; and three or more capacitors embedded in the circuit substrate, the capacitors being connected in parallel and in a daisy chain by connecting the terminal electrodes of each of two of the capacitors through first wiring lines, wherein a pair of first inspection electrodes and a pair of second inspection electrodes are formed on a first main surface of the circuit substrate, wherein the respective first inspection electrodes are connected to the respective terminal electrodes of the capacitor in an end of a parallel line through respective second wiring lines, the respective first and second wiring lines being connected to different areas at the respective terminal electrodes of the capacitor in the end of the parallel line, wherein the respective second inspection electrodes are connected to the respective terminal electrodes of the capacitor in another end of the parallel line through respective third wiring lines.

In such a component-embedded circuit substrate, if there is a mounting defect such as a wiring disconnection of any of the capacitors, the composite capacitance of the capacitors connected from the first inspection electrodes to the mounting defect area is measured. In a similar manner, the composite capacitance of the capacitors connected from the second inspection electrode to the mounting defect area is measured. Accordingly, in the inspection of the component-embedded circuit substrate according to the present invention, the component-embedded circuit substrate may be judged to be non-defective when the capacitance between the pair of first inspection electrodes and the capacitance between the pair of second inspection electrodes are measured and are respectively within the total range of tolerance of the composite capacitance of all capacitors. Furthermore, the component-embedded circuit substrate may be judged to be non-defective when the capacitance between the pair of first inspection electrodes and the capacitance between the pair of second inspection electrodes are measured and are respectively the same capacitance value. However, in case of the latter, some circumstances make it impossible to detect mounting defects, such as an odd number of capacitors, each of the capacitances having the same capacitance, the mounting defect area being in the center of the parallel connection sequence, and the like.

According to the present invention as described above, a mounting defect of a capacitor can be reliably detected in a component-embedded circuit substrate having parallel capacitor circuits embedded therein, with few inspection steps and with ordinary inspection equipment.

It is to be understood that both the foregoing general description and the following detailed description are exemplary and explanatory, and are intended to provide further explanation of the invention as claimed.

DETAILED DESCRIPTION OF THE PREFERRED EMBODIMENTS (Embodiment 1)

Figure 1:
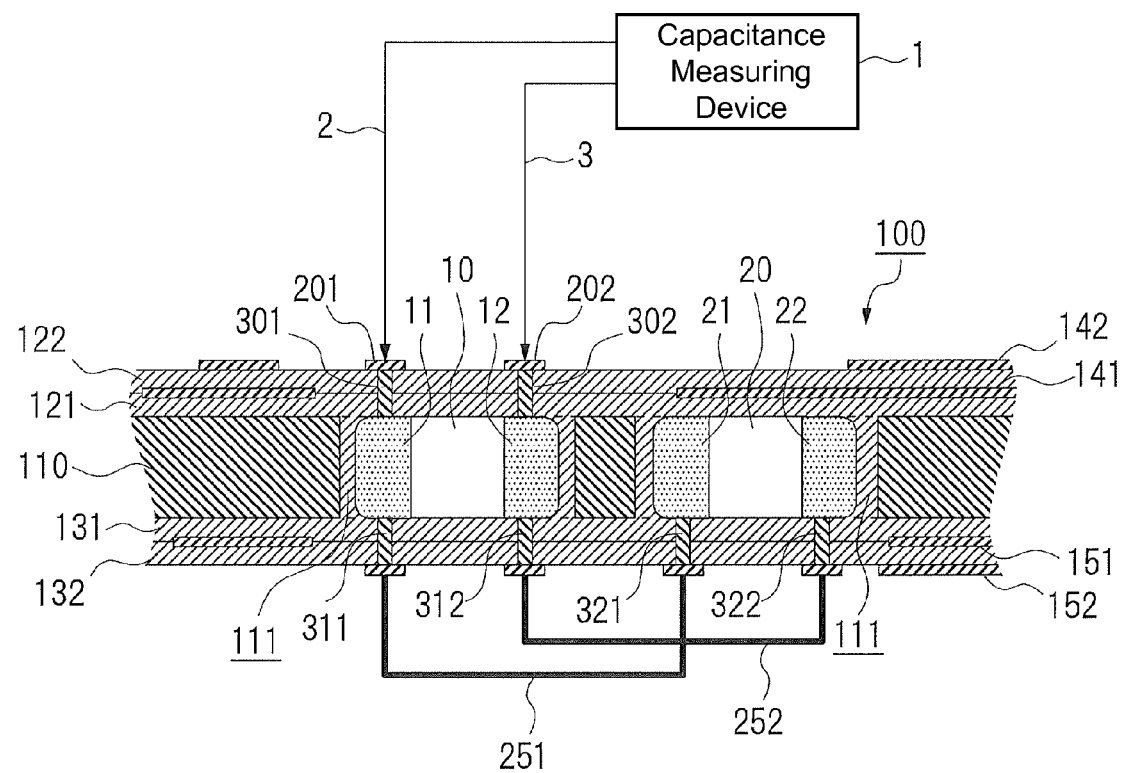
FIG. 1 is a schematic cross-sectional view of a component-embedded circuit substrate according to Embodiment 1.

A component-embedded circuit substrate according to Embodiment 1 of the present invention will be explained with reference to a figure. FIG. 1 is a schematic cross-sectional view showing the component-embedded circuit substrate according to Embodiment 1. In the present embodiment, for ease of explanation, only main configurations relating to the gist of the present invention will be explained.

A component-embedded circuit substrate (hereinafter, "circuit substrate") 100 is a multilayer substrate formed by alternately stacking insulating layers and conductive layers. As shown in FIG. 1, the circuit substrate 100 includes: a core layer 110 that is a relatively thick metal conductive layer having good conductive characteristics; a plurality (two each in the present embodiment) of insulating layers 121 to 122 and conductive layers 141 to 142 formed on one main surface (the top surface) of the core layer 110; and a plurality (two each in the present embodiment) of insulating layers 131 to 132 and conductive layers 151 to 152 formed on the other main surface (the bottom surface) of the core layer 110. The insulating layers 121 and 122, and 131 and 132, and the conductive layers 141 and 142, and 151 and 152 are formed on both main surfaces of the core layer 110 by the build-up method. The insulating layers 121 and 122, and 131 and 132 are made of an epoxy resin, a polyimide, a bismaleimide-triazine resin, or a synthetic resin (possible to use a thermoplastic material in addition to a thermosetting material) such as a material that includes a reinforced filler made of glass fiber or the like in the above. The thickness of the respective insulating layers 121 to 122 and 131 to 132 is within the range of 10 to 30 μm, for example. The respective conductive layers 141 and 142, and 151 and 152 are made of a metal such as copper or a copper alloy, and the thickness thereof is within the range of 5 to 25 μm, for example. As described later, sometimes via conductors are arranged in the respective conductive layers 141 and 142, and 151 and 152, and these via conductors are made of a metal such as copper or a copper alloy, with a diameter within the range of 10 to 80 μm, for example. The conductive layers 142 and 152 correspond to respective surface layers of the circuit substrate 100.

The core layer 110 has penetrating holes 111 to house electronic components therein. A first capacitor 10 and a second capacitor 20 are respectively arranged in these penetrating holes 111. Therefore, it is preferable that the thickness of the core layer 110 be greater than the height of the electronic components stored therein and that the core layer 110 have a great bending strength. The core layer 110 is made of an electrically conductive material, and provided with a reference potential (ground). In other words, the core layer 110 is one of the conductive layers of the circuit substrate 100. In the present embodiment, the core layer 110 is made of a metal plate, or more specifically, a metal plate made of a copper or a copper alloy. The thickness of the core layer 110 is within the range of 100 to 400 μm, for example. Spaces around the stored components in the penetrating holes 111 are filled with an insulating member such as a resin.

A pair of inspection electrodes 201 and 202 are formed in the conductive layer 142, or namely, on one of the main surfaces of the circuit substrate 100. The inspection electrode 201 is connected to one terminal electrode 11 of the first capacitor 10 through a via conductor 301. In a similar manner, the inspection electrode 202 is connected to another terminal electrode 12 of the first capacitor 10 through a via conductor 302. In other words, the via conductors 301 and 302 are wiring lines that respectively connect the inspection electrodes 201 and 202 to the terminal electrodes 11 and 12 of the first capacitor 10.

The terminal electrode 11 of the first capacitor 10 is connected through a via conductor 311 to a pattern 251 formed in the conductive layer 152, or namely, the other main surface of the circuit substrate 100. In a similar manner, the other terminal electrode 12 of the first capacitor 10 is connected through a via conductor 312 to a pattern 252 formed in the conductive layer 152. One terminal electrode 21 of the second capacitor 20 is connected to the pattern 251 through a via conductor 321. In a similar manner, the other terminal electrode 22 of the second capacitor 20 is connected through a via conductor 322 to the pattern 252. In other words, the first capacitor 10 and second capacitor 20 are connected in parallel. The via conductors 311 and 312, patterns 251 and 252, and via conductors 321 and 322 are wiring lines that respectively connect the terminal electrodes 11 and 12 of the first capacitor 10 to the terminal electrodes 21 and 22 of the second capacitor 20. It should be noted that the depiction of the patterns 251 and 252 in FIG. 1 is simplified in order to clarify the connection of the parallel circuits. Although omitted in FIG. 1, the via conductors 301 and 302 are each connected to respective patterns (not shown) for being connected to actual electronic circuits that are not used for inspection.

A feature of the present invention is that, at the terminal electrodes 11 and 12 of the first capacitor 10, the connection position of the via conductors 301 and 302 for connecting the inspection electrodes 201 and 202 is different from the connection position of the via conductors 311 and 312 for connecting the patterns 251 and 252. In the example shown in FIG. 1, the via conductors 301 and 302 are respectively connected to the top surface (one main surface side of the circuit substrate 100) of the terminal electrodes 11 and 12. On the other hand, the via conductors 311 and 312 are connected to the bottom surface (the other main surface side of the circuit substrate 100) of the terminal electrodes 11 and 12. Accordingly, the inspection electrodes 201 and 202 are connected to the terminal electrodes 21 and 22 of the second capacitor 20 through the via conductors 311 and 312, terminal electrodes 11 and 12 of the first capacitor 10, patterns 251 and 252, and via conductors 321 and 322. In other words, the current that flows between the inspection electrodes 201 and 202 and the terminal electrodes 21 and 22 of the second capacitor 20 will inevitably pass through the terminal electrodes 11 and 12 of the first capacitor 10.

To inspect the mounting state of the circuit substrate 100 of the present embodiment, first, inspection terminals 2 and 3 of a conventional capacitance measuring device 1 are connected to the inspection electrodes 201 and 202, and the capacitance between the inspection electrodes 201 and 202 is measured. If the measured capacitance is within the range of tolerance of the composite capacitance of the first capacitor 10 and second capacitor 20, the mounting of the first capacitor 10 and second capacitor 20 is judged to be non-defective. However, if the measured capacitance is 0, or in other words, if the space between the inspection electrodes 201 and 202 is open, then the first capacitor 10 is judged to have a mounting defect. Specifically, it is judged that a mounting defect has occurred with the via conductors 301 and 302. If the measured capacitance is within the range of tolerance for the capacitance of the first capacitor 10, a mounting defect is judged to have occurred between the first capacitor 10 and the second capacitor 20. Specifically, it is judged that a mounting defect has occurred at the via conductors 311 and 312, patterns 251 and 252, or via conductors 321 and 322.

According to the present invention as above, a mounting defect of the parallel capacitor circuits embedded in the circuit substrate 100 can be reliably detected. Such a technology is particularly useful when the first capacitor 10 has a smaller capacitance than the second capacitor 20, or more specifically, when the capacitance of the first capacitor is less than or equal to the tolerance of the capacitance of the second capacitor. An example of such a case includes when the capacitance of the first capacitor is 33 pF, the capacitance of the second capacitor is 2.2 µF, and the tolerance range of both capacitors is ±10%, for example.

(Embodiment 2)

Figure 2:
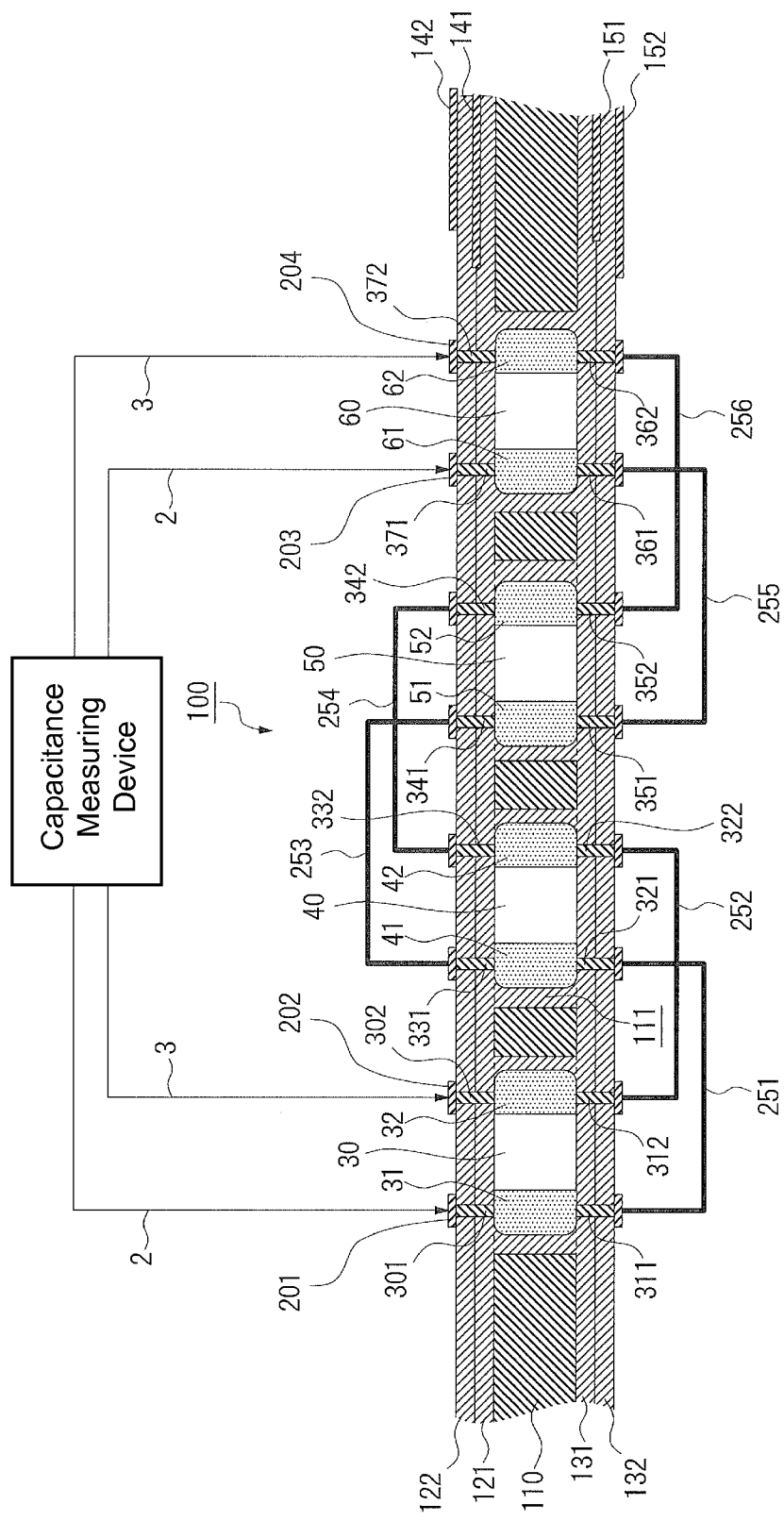
FIG. 2 is a schematic cross-sectional view of a component-embedded circuit substrate according to Embodiment 2.

A component-embedded circuit substrate according to Embodiment 2 of the present invention will be explained with reference to a figure. FIG. 2 is a schematic cross-sectional view showing the component-embedded circuit substrate according to Embodiment 2. In the present embodiment, for ease of explanation, only main configurations relating to the gist of the present invention will be explained.

Embodiment 2 differs from Embodiment 1 in that Embodiment 1 has two capacitors 10 and 20 with different capacitances embedded in the circuit substrate, whereas the present embodiment has three or more capacitors with the same capacitance connected in parallel. In general, only the differences will be explained here.

As shown in FIG. 2, four penetrating holes 111 are formed in a core layer 110 of a circuit substrate 100. First to fourth capacitors 30 to 60 are respectively arranged in the penetrating holes 111. The layer structure of the circuit substrate 100 is similar to Embodiment 1; therefore, an explanation thereof will be omitted.

A pair of first inspection electrodes 201 and 202 and a pair of second inspection electrodes 203 and 204 are formed in a conductive layer 142, or in other words, on one main surface of the circuit substrate 100. The first inspection electrode 201 is connected to one terminal electrode 31 of the first capacitor 30 through a via conductor 301. In a similar manner, the first inspection electrode 202 is connected to another terminal electrode 32 of the first capacitor 30 through a via conductor 302. The terminal electrode 31 of the first capacitor 30 is connected through a via conductor 311 to a pattern 251 formed in a conductive layer 152, or namely, on the other main surface of the circuit substrate 100. In a similar manner, the other terminal electrode 32 of the first capacitor 30 is connected through a via conductor 312 to a pattern 252 formed in the conductive layer 152.

One terminal electrode 41 of a second capacitor 40 is connected to the pattern 251 through a via conductor 321. In a similar manner, another terminal electrode 42 of the second capacitor 40 is connected through the via conductor 322 to the pattern 252. The terminal electrode 41 of the second capacitor 40 is connected through a via conductor 331 to a pattern 253 formed in the conductive layer 142. In a similar manner, the other terminal electrode 42 of the second capacitor 40 is connected through a via conductor 332 to a pattern 254 formed in the conductive layer 142.

One terminal electrode 51 of a third capacitor 50 is connected to the pattern 253 through a via conductor 341. In a similar manner, another terminal electrode 52 of the third capacitor 50 is connected through a via conductor 342 to the pattern 254. The terminal electrode 51 of the third capacitor 50 is connected through a via conductor 351 to a pattern 255 formed in the conductive layer 152. In a similar manner, the other terminal electrode 52 of the third capacitor 50 is connected through a via conductor 352 to a pattern 256 formed in the conductive layer 152.

One terminal electrode 61 of a fourth capacitor 60 is connected to the pattern 255 through a via conductor 361. In a similar manner, another terminal electrode 62 of the fourth capacitor 60 is connected through a via conductor 362 to the pattern 256. The terminal electrode 61 of the fourth capacitor 60 is connected through a via conductor 371 to the second inspection electrode 203 formed on the conductive layer 142. In a similar manner, the other terminal electrode 62 of the fourth capacitor 60 is connected through a via conductor 372 to the second inspection electrode 204 formed on the conductive layer 142.

As described above, the first capacitor 30 to fourth capacitor 60 are connected in parallel. It should be noted that the depiction of the patterns 251 to 256 in FIG. 2 is simplified in order to clarify the connection of the parallel circuits. Although omitted in FIG. 2, the via conductors or patterns are each connected to respective patterns (not shown) for being connected to actual electronic circuits that are not used for inspection.

A feature of the present invention is that, at the terminal electrodes of the respective capacitors 30 to 60, the connection positions of the via conductors for connecting adjacent capacitors 30 to 60 to first and second inspection electrodes 201 to 204 differ from each other. In the example shown in FIG. 2, at the terminal electrodes 31 and 32 of the first capacitor 30, the connection position of the via conductors 301 and 302 for respectively connecting the inspection electrodes 201 and 202 differs from the connection position of the via conductors 311 and 312 for connecting the patterns 251 and 252, for example. This is similar for the fourth capacitor 60. In the example shown in FIG. 2, at the terminal electrodes 41 and 42 of the second capacitor 40, the connection position of the via conductors 321 and 322 for connecting the patterns 251 and 252 differs from the connection position of the via conductors 331 and 332 for connecting the patterns 253 and 254. This is similar for the third capacitor 50. Due to this, the respective capacitors 30 to 60 are connected in parallel in a daisy chain. In other words, current that flows between the first inspection electrodes 201 and 202 and the second inspection electrodes 203 and 204 will inevitably pass through the terminal electrodes of the respective capacitors 30 to 60.

To inspect the mounting state of the circuit substrate 100 of the present embodiment, first, inspection terminals 2 and 3 of a conventional capacitance measuring device 1 are connected to the first inspection electrodes 201 and 202, and the capacitance between the inspection electrodes 201 and 202 is measured. Next, the inspection terminals 2 and 3 of the capacitance measuring device 1 are connected to the second inspection electrodes 203 and 204, and the capacitance between the inspection electrodes 203 and 204 is measured. The mounting of the respective capacitors 30 to 60 is judged to be non-defective if the respective measured capacitances are within the tolerance range of the composite capacitance of the respective capacitors 30 to 60. The mounting of the capacitors 30 to 60 is also judged to be non-defective if the respective measured capacitances are substantially the same values within the range of measurement error. In cases other than these, a mounting defect can be judged to have occurred. Both judging standards may be used together.

Areas where a mounting defect has occurred can be estimated from the respective measured capacitances or the ratio of the capacitances. If the measured capacitance at the first inspection electrodes 201 and 202 is 0, or in other words, if the space between the inspection electrodes 201 and 202 is open, then the first capacitor 10 is judged to have a mounting defect. Specifically, it is judged that a mounting defect has occurred with the via conductors 301 and 302.

According to the present invention as described above, a mounting defect of parallel capacitor circuits embedded in the circuit substrate 100 can be reliably detected. Such a technology is useful when the capacitances of the respective capacitors are less than or equal to the sum of the tolerances of the capacitances of all capacitors. An example of such a case includes, in FIG. 2, the capacitances of the respective capacitors 30 to 60 being 2.2 µF with a tolerance range of 25%.

Embodiments of the present invention were described above, but the present invention is not limited thereto. In the respective embodiments above, the respective capacitors were arranged such that the direction in which the terminal electrodes are linked is the same, but the mounting direction of the respective capacitors is not limited thereto.

In the respective embodiments above, patterns connecting the capacitors were formed in a surface layer of the circuit substrate, but the pattern may be formed in a layer of the circuit substrate. In the respective embodiments above, the circuit substrate includes two layers each of conductive layers (one of each being a surface layer) with a core layer as the center of the circuit substrate, but the circuit substrate may have only surface layers. In the respective embodiments above, the core layer was formed by a metal material having conductive characteristics, but the core layer may be formed of an insulating material such as a resin, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A component-embedded circuit substrate, comprising:
a circuit substrate; and
a first capacitor and a second capacitor embedded in the circuit substrate, the first capacitor and the second capacitor being connected in parallel by first wiring lines,
wherein a capacitance of the second capacitor is greater than a capacitance of the first capacitor,
wherein a pair of inspection electrodes are formed on a first main surface of the circuit substrate,
wherein the inspection electrodes are respectively connected to terminal electrodes of the first capacitor through second wiring lines,
wherein each of the first wiring lines includes a pattern for connecting the first and second capacitors together, said pattern being formed on a second main surface of the circuit substrate or formed in an inner layer further towards the second main surface than the first and second capacitors, and each of the first wiring lines further includes first via conductors that respectively connects said pattern to a corresponding one of the terminal electrodes of the first capacitor and to a corresponding one of terminal electrodes of the second capacitor,
wherein each of the second wiring lines includes a second via conductor that extends from a corresponding one of the terminal electrodes of the first capacitor to the first main surface, and wherein at each of the terminal electrodes of the first capacitor, a position at which the first via conductor is connected to the terminal electrode is different from a position at which the second via conductor is connected to the terminal electrode.

2. The component-embedded circuit substrate according to claim 1,
wherein the inspection electrodes are respectively connected to the terminal electrodes of the second capacitor through the second wiring lines, the terminal electrodes of the first capacitor, and the first wiring lines.

3. The component-embedded circuit substrate according to claim 1,
wherein the capacitance of the first capacitor is less than or equal to a capacitance tolerance of the second capacitor.

4. The component-embedded circuit substrate according to claim 2,
wherein the capacitance of the first capacitor is less than or equal to a capacitance tolerance of the second capacitor.

5. The component-embedded circuit substrate according to claim 1,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the first capacitor and the second capacitor are respectively arranged in penetrating holes formed in the core layer.

6. The component-embedded circuit substrate according to claim 2,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the first capacitor and the second capacitor are respectively arranged in penetrating holes formed in the core layer.

7. The component-embedded circuit substrate according to claim 3,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the first capacitor and the second capacitor are respectively arranged in penetrating holes formed in the core layer.

8. The component-embedded circuit substrate according to claim 4,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the first capacitor and the second capacitor are respectively arranged in penetrating holes formed in the core layer.

9. A component-embedded circuit substrate, comprising:
a circuit substrate; and
three or more capacitors embedded in the circuit substrate, the capacitors being connected in parallel and in a daisy chain by connecting terminal electrodes of the capacitors through first wiring lines,
wherein at each of the terminal electrodes of the capacitors in the daisy chain, a connection position of the first wiring line connecting to the terminal electrode of another capacitor is different from a connection position of the first wiring line connecting to the terminal electrode of yet another capacitor,
wherein a pair of first inspection electrodes and a pair of second inspection electrodes are formed on a first main surface of the circuit substrate,
wherein in one end of the parallel daisy chain, the respective first inspection electrodes are connected to the respective terminal electrodes of the capacitor in said one end through respective second wiring lines, and at each of the terminal electrodes of the capacitor in said end, a position at which the first wiring line is connected to the terminal electrode is different from a position at which the second wiring line is connected to the terminal electrode, and
wherein in another end of the parallel daisy chain, the respective second inspection electrodes are connected to the respective terminal electrodes of the capacitor in said another end through respective third wiring lines, and at each of the terminal electrodes of the capacitor in said another end, a position at which the first wiring line is connected to the terminal electrode is different from a position at which the third wiring line is connected to the terminal electrode.

10. The component-embedded circuit substrate according to claim 9,
wherein a capacitance of each of the capacitors is less than or equal to a sum of capacitance tolerances of all the capacitors.

11. The component-embedded circuit substrate according to claim 9,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the capacitors are respectively arranged in penetrating holes formed in the core layer.

12. The component-embedded circuit substrate according to claim 10,
wherein the circuit substrate is a multilayer circuit substrate formed by alternately stacking insulating layers and conductive layers, the conductive layers including a core layer having a greater thickness than the other conductive layers and being an inner layer of the multilayer circuit substrate, and
wherein the capacitors are respectively arranged in penetrating holes formed in the core layer.

13. A method of inspecting the component-embedded circuit substrate set forth in claim 9, comprising:
measuring a capacitance between the pair of first inspection electrodes and a capacitance between the pair of second inspection electrodes; and
judging the component-embedded circuit substrate to be non-defective if each of the measured capacitances is within a tolerance range of a total capacitance of all the capacitors.

14. A method of inspecting the component-embedded circuit substrate set forth in claim 10, comprising:

measuring a capacitance between the pair of first inspection electrodes and a capacitance between the pair of second inspection electrodes; and judging the component-embedded circuit substrate to be non-defective if each of the measured capacitances is within a tolerance range of a total capacitance of all the capacitors.

15. A method of inspecting the component-embedded circuit substrate set forth in claim 11, comprising:

measuring a capacitance between the pair of first inspection electrodes and a capacitance between the pair of second inspection electrodes; and judging the component-embedded circuit substrate to be non-defective if each of the measured capacitances is within a tolerance range of a total capacitance of all the capacitors.

16. A method of inspecting the component-embedded circuit substrate set forth in claim 12, comprising:

measuring a capacitance between the pair of first inspection electrodes and a capacitance between the pair of second inspection electrodes; and judging the component-embedded circuit substrate to be non-defective if each of the measured capacitances is within a tolerance range of a total capacitance of all the capacitors.

17. A method of inspecting the component-embedded circuit substrate as set forth in claim 9, comprising:

measuring a capacitance between the pair of first inspection electrodes and a capacitance between the pair of second inspection electrodes; and judging the component-embedded substrate to be non-defective if the measured capacitances are substantially the same.

18. A method of inspecting the component-embedded circuit substrate as set forth in claim 10, comprising:

measuring a capacitance between the pair of first inspection electrodes and a capacitance between the pair of second inspection electrodes; and judging the component-embedded substrate to be non-defective if the measured capacitances are substantially the same.

19. A method of inspecting the component-embedded circuit substrate as set forth in claim 11, comprising:

measuring a capacitance between the pair of first inspection electrodes and a capacitance between the pair of second inspection electrodes; and judging the component-embedded substrate to be non-defective if the measured capacitances are substantially the same.

20. A method of inspecting the component-embedded circuit substrate as set forth in claim 12, comprising:

measuring a capacitance between the pair of first inspection electrodes and a capacitance between the pair of second inspection electrodes; and judging the component-embedded substrate to be non-defective if the measured capacitances are substantially the same.

* * * * *